(12) United States Patent
Wang et al.

(10) Patent No.: US 10,170,458 B2
(45) Date of Patent: Jan. 1, 2019

(54) MANUFACTURING METHOD OF PACKAGE-ON-PACKAGE STRUCTURE

(71) Applicant: Powertech Technology Inc., Hsinchu County (TW)

(72) Inventors: Chi-An Wang, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/782,862

(22) Filed: Oct. 13, 2017

(65) Prior Publication Data

US 2018/0114704 A1    Apr. 26, 2018

Related U.S. Application Data

(60) Provisional application No. 62/410,851, filed on Oct. 21, 2016.

(51) Int. Cl.
*H01L 23/00*    (2006.01)
*H01L 25/00*    (2006.01)
(Continued)

(52) U.S. Cl.
CPC ............ *H01L 25/50* (2013.01); *H01L 21/486* (2013.01); *H01L 21/4853* (2013.01); *H01L 21/4889* (2013.01); *H01L 21/56* (2013.01); *H01L 21/563* (2013.01); *H01L 21/565* (2013.01); *H01L 23/04* (2013.01); *H01L 23/3121* (2013.01); *H01L 23/3128* (2013.01); *H01L 23/4334* (2013.01); *H01L 23/49* (2013.01); *H01L 23/49811* (2013.01); *H01L 23/49816* (2013.01); *H01L 23/49827* (2013.01); *H01L 23/49833* (2013.01); *H01L 23/50* (2013.01); *H01L 23/5384* (2013.01); *H01L 24/03* (2013.01);
(Continued)

(58) Field of Classification Search
CPC .................................................. H01L 25/06757
See application file for complete search history.

(56) References Cited

U.S. PATENT DOCUMENTS 8,877,554 B2    11/2014  Tsai et al.
9,142,502 B2     9/2015  Gong et al.
(Continued)

*Primary Examiner* — Kyoung Lee
*Assistant Examiner* — Christina Sylvia
(74) *Attorney, Agent, or Firm* — JCIPRNET

(57) ABSTRACT

A manufacturing method of a POP structure including at least the following steps is provided. A first package structure is formed and a second package structure is formed on the first package structure. The first package structure includes a circuit carrier and a die disposed on the circuit carrier. Forming the first package structure includes providing a conductive interposer on the circuit carrier, encapsulating the conductive interposer by an encapsulant and removing a portion of the encapsulant and the plate of the conductive interposer. The conductive interposer includes a plate, a plurality of conductive pillars and a conductive protrusion respectively extending from the plate to the circuit carrier and the die. The conductive protrusion disposed on the die, and the conductive pillars are electrically connected to the circuit carrier. The second package structure is electrically connected to the first package structure through the conductive interposer.

18 Claims, 15 Drawing Sheets

(51) Int. Cl.
*H01L 21/48* (2006.01)
*H01L 23/31* (2006.01)
*H01L 23/498* (2006.01)
*H01L 25/10* (2006.01)
*H01L 23/49* (2006.01)
*H01L 23/50* (2006.01)
*H01L 21/56* (2006.01)
*H01L 23/538* (2006.01)
*H01L 25/065* (2006.01)
*H01L 23/04* (2006.01)
*H01L 23/433* (2006.01)

(52) U.S. Cl.
CPC .............. *H01L 24/11* (2013.01); *H01L 24/27* (2013.01); *H01L 24/83* (2013.01); *H01L 24/97* (2013.01); *H01L 25/0657* (2013.01); *H01L 25/105* (2013.01); *H01L 23/49838* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01); *H01L 2224/03* (2013.01); *H01L 2224/0401* (2013.01); *H01L 2224/04042* (2013.01); *H01L 2224/13023* (2013.01); *H01L 2224/13147* (2013.01); *H01L 2224/16227* (2013.01); *H01L 2224/16235* (2013.01); *H01L 2224/16237* (2013.01); *H01L 2224/2919* (2013.01); *H01L 2224/29139* (2013.01); *H01L 2224/32225* (2013.01); *H01L 2224/32245* (2013.01); *H01L 2224/45144* (2013.01); *H01L 2224/45147* (2013.01); *H01L 2224/48091* (2013.01); *H01L 2224/48227* (2013.01); *H01L 2224/48235* (2013.01); *H01L 2224/73253* (2013.01); *H01L 2224/73265* (2013.01); *H01L 2224/92225* (2013.01); *H01L 2225/1023* (2013.01); *H01L 2225/1035* (2013.01); *H01L 2225/1041* (2013.01); *H01L 2225/1058* (2013.01); *H01L 2225/1088* (2013.01); *H01L 2225/1094* (2013.01); *H01L 2924/1431* (2013.01); *H01L 2924/1433* (2013.01); *H01L 2924/1533* (2013.01); *H01L 2924/15311* (2013.01); *H01L 2924/181* (2013.01)

(56) References Cited

U.S. PATENT DOCUMENTS

| 9,355,944 | B1 | 5/2016 | Liu et al. | |
| 9,613,931 | B2* | 4/2017 | Lin | H01L 25/0652 |
| 2014/0346666 | A1* | 11/2014 | Chen | H01L 24/11 |
| | | | | 257/737 |
| 2016/0035664 | A1 | 2/2016 | We et al. | |
| 2016/0071820 | A1* | 3/2016 | Yu | H01L 21/6835 |
| | | | | 257/737 |

* cited by examiner

MANUFACTURING METHOD OF PACKAGE-ON-PACKAGE STRUCTURE

CROSS REFERENCE TO RELATED APPLICATION

This application claims the priority benefit of U.S. provisional application Ser. No. 62/410,851, filed on Oct. 21, 2016. The entirety of the above-mentioned patent application is hereby incorporated by reference herein and made a part of the specification.

BACKGROUND OF THE INVENTION

1. Field of the Invention

The present invention generally relates to a manufacturing method of a package structure, and more particularly relates to a manufacturing method of a package-on-package (POP) structure.

2. Description of Related Art

In order for electronic product design to achieve being light, slim, short, and small, semiconductor packaging technology has kept progressing, in attempt to develop products that are smaller in volume, lighter in weight, higher in integration, and more competitive in the market. For example, 3D stacking technologies such as POP have been developed to meet the requirements of higher packaging densities. As such, how to achieve a thinner POP structure with lower manufacturing cost has become a challenge to researchers in the field.

SUMMARY OF THE INVENTION

The disclosure provides a manufacturing method of a package-on-package (POP) structure, which reduces the overall thickness and the manufacturing cost thereof.

The disclosure provides a manufacturing method of a POP structure. The method includes at least the following steps. A first package structure is formed and a second package structure is formed on the first package structure. The first package structure includes a circuit carrier and a die disposed on the circuit carrier. Forming the first package structure includes providing a conductive interposer on the circuit carrier, encapsulating the conductive interposer by an encapsulant and removing a portion of the encapsulant and the plate of the conductive interposer. The conductive interposer includes a plate, a plurality of conductive pillars and a conductive protrusion respectively extending from the plate to the circuit carrier and the die. The conductive protrusion disposed on the die, and the conductive pillars are electrically connected to the circuit carrier. The second package structure is electrically connected to the first package structure through the conductive interposer.

The disclosure provides a manufacturing method of a POP structure. The method includes at least the following steps. A first package structure is formed and a second package structure is formed on the first package structure. The first package structure includes a circuit carrier and a die disposed on the circuit carrier. Forming the first package structure includes providing a conductive interposer on the circuit carrier, encapsulating the conductive interposer by an encapsulant and removing a portion of the encapsulant and a portion of the conductive interposer. The conductive interposer includes a die positioning region. An orthographic projection area of the die positioning region on the circuit carrier is equal to an orthographic projection area of the die on the circuit carrier. A surface of the conductive interposer is exposed by the encapsulant. The second package structure is electrically connected to the first package structure through the conductive interposer.

Based on the above, since the thickness of the encapsulant is reduced and also the plate of the conductive interposer is removed to form the first package structure, the conductive pillars of the conductive interposer exposed from the encapsulant may serve as the electrical connecting path between the first package structure and the second package structure and the conductive protrusion may exposed from the encapsulant may serve as the heat sink for a better heat dissipation efficiency. In other word, it is unnecessary to dispose additional interposer between the first package structure and the second package structure for electrical connection therebetween. The overall thickness reduction in the package structure can be reduced after removing a portion of the encapsulant and a plate of the conductive interposer, thereby achieving package miniaturization. The thermal interface material formed on the top surface of the conductive protrusion is conducive to bond the second package structure to the first package structure and improve the heat dissipation from the first package structure. When providing the conductive interposer on the circuit carrier, the alignment window may be aligned with the die. That is, it is no need to form additional alignment mark to align the conductive interposer with the die. Hence, the overall thickness of the POP structure may be reduced and the lower manufacturing costs may be achieved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
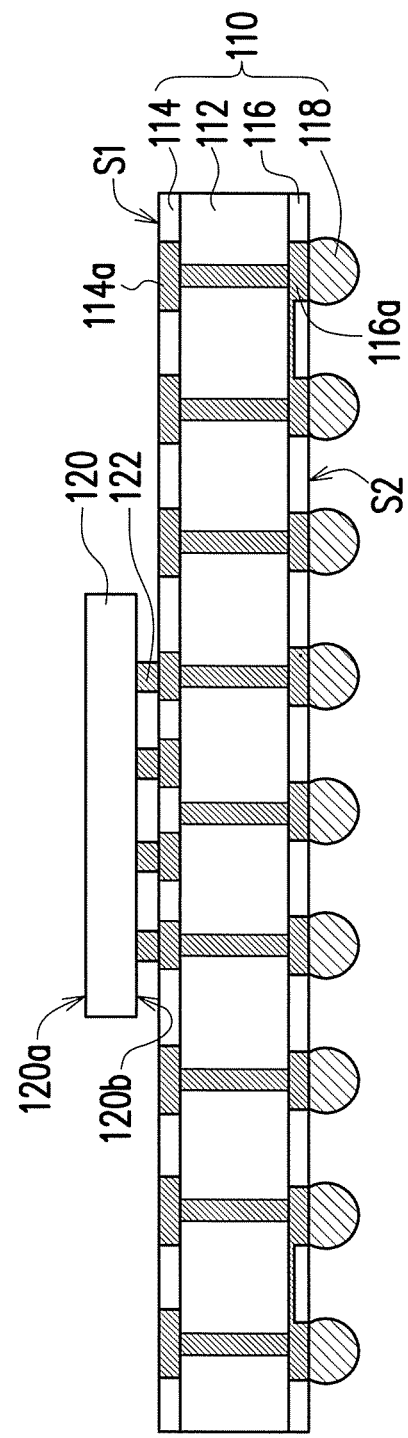
FIG. 1A to FIG. 1E are schematic cross-sectional views illustrating manufacturing method of a POP structure according to an embodiment of the disclosure.

Reference will now be made in detail to the present preferred embodiments of the disclosure, examples of which are illustrated in the accompanying drawings.

Wherever possible, the same reference numbers are used in the drawings and the description to refer to the same or like parts.

FIG. 1A to FIG. 1E are schematic cross-sectional views illustrating manufacturing method of a POP structure according to an embodiment of the disclosure. Referring to FIG. 1A, a first circuit carrier 110 is provided and a first die 120 is bonded on the first circuit carrier 110. The first circuit carrier 110 may have a top surface S1 and a bottom surface S2 opposite to the top surface S1. For example, the first circuit carrier 110 may include a core layer 112, a top circuit layer 114 disposed on the top surface S1 and the bottom circuit layer 116 disposed on the bottom surface S2 of the first circuit carrier 110. The core layer 112 is disposed between and electrically connects the top circuit layer 114 and the bottom circuit layer 116. In some embodiments, the top circuit layer 114 and the bottom circuit layer 116 may respectively include a plurality of conductive pads 114a and 116a, used for further electrical connection. Moreover, the conductive pads 114a and the conductive pads 116a may be formed by the same material and the same process such as using copper, solder, gold, nickel, or the like through photolithography and etching processes. In some other embodiments, the conductive pads 114a and the conductive pads 116a may be formed by different materials and/or different processes according to the design requirement.

The core layer 112 may further include embedded circuit layers serving as an intermediate circuit layer electrically connected to the top circuit layer 114 and the bottom circuit layer 116. The core layer 112 may include a base layer and a plurality of conductive vias penetrating through the base layer. The two opposite ends of the conductive vias of the core layer 112 may electrically connect to the conductive pads 114a of the top circuit layer 114 and the conductive pads 116a of the bottom circuit layer 116. In some embodiments, a plurality of conductive structures 118 may be formed on the bottom surface S2 of the first circuit carrier 110. For example, a material of the conductive structures 118 may include copper, tin, gold, nickel or other suitable conductive material. The conductive structures 118 may be, for example, conductive bumps, conductive pillars, or solder balls formed by a ball placement process and a reflow process. It should be noted that other possible forms and shapes of the conductive structures 118 may be utilized for further electrical connection. In some embodiments, the conductive structures 118 may form an array arranged to have fine pitch on the bottom surface S2 of the first circuit carrier 110 for requirement in the subsequent processes.

The first die 120 may be disposed on the top surface S1 of the first circuit carrier 110. The first die 120 may be electrically connected to the first circuit carrier 110 through flip-chip bonding. It should be noted that the first die 120 may be bonded to the first circuit carrier 110 by other methods and the details will be described later in other embodiments. In the present embodiment, for example, the first die 120 may include an active surface 120a facing toward the first circuit carrier 110 and an inactive surface 120b opposite to the active surface 120a. In addition, the active surface 120a of the first die 120 may be coupled to the conductive pads 114a of the top circuit layer 114 of the first circuit carrier 110 through a plurality of conductive bumps 122. The conductive bumps 122 may be copper bumps. In some embodiments, solders (not illustrated) may be applied onto surfaces of the conductive bumps 122 to couple with the conductive pads 114a. The first die 120 may be, for example, an ASIC (Application-Specific Integrated Circuit). In some embodiments, the first die 120 may be used to perform logic applications. However, it construes no limitation in the disclosure. Other suitable active devices may also be utilized as the first die 120.

Figure 1B:
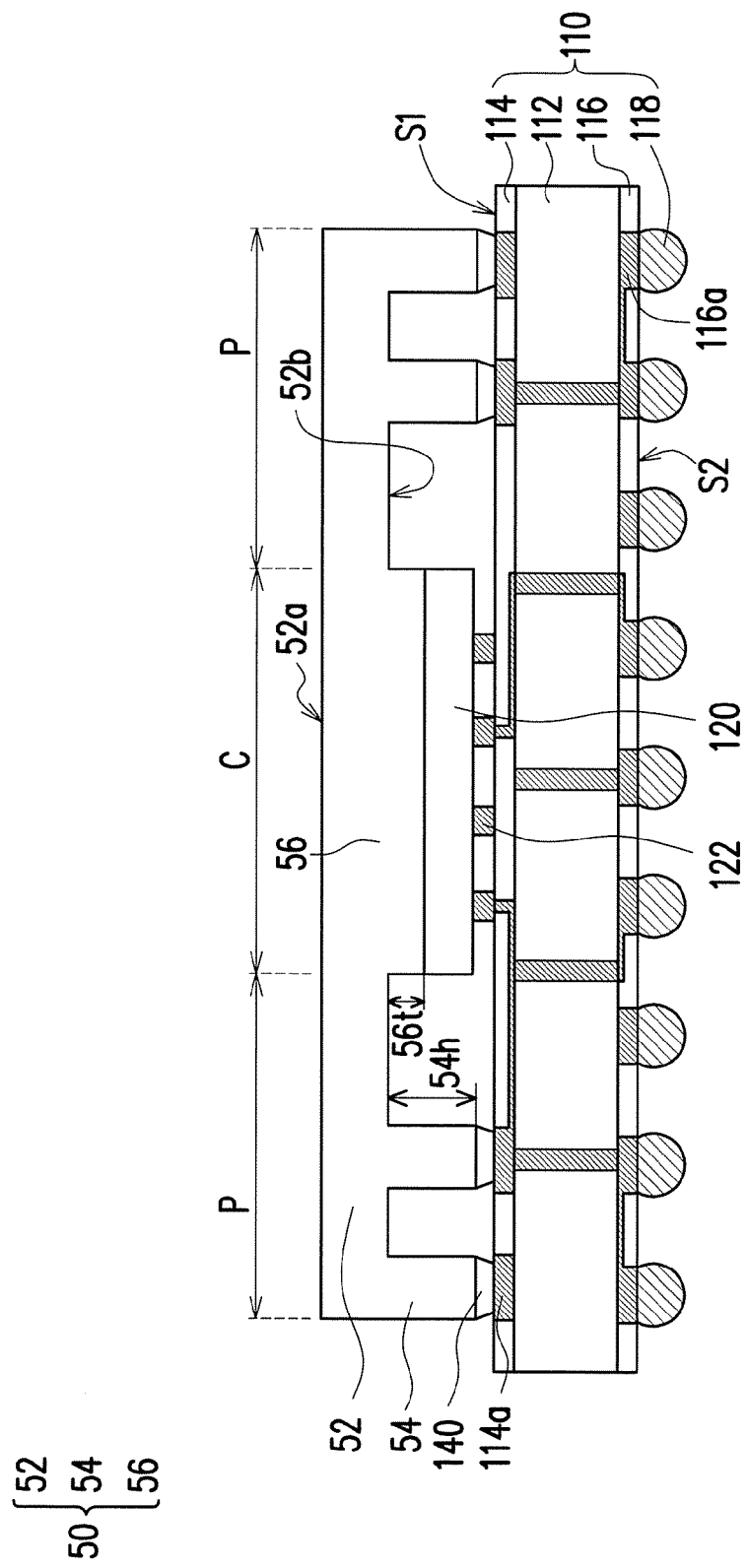

Referring to FIG. 1B, a conductive interposer 50 is provided on the first circuit carrier 110. In some embodiments, the conductive interposer 50 includes a plate 52, a plurality of conductive pillars 54 and a conductive protrusion 56. For example, the plate 52 has a top surface 52a and a bottom surface 52b opposite to the top surface 52a. The conductive pillars 54 and the conductive protrusion 56 are formed on the bottom surface 52b of the plate 52. In some embodiments, the conductive pillars 54 and the conductive protrusion 56 respectively extend to the first circuit carrier 110 and the first die 120. After the conductive interposer 50 is provided on the first circuit carrier 110, the plate 52 is disposed above the first circuit carrier 110, the conductive pillars 54 are electrically connected to the first circuit carrier 110 and the conductive protrusion 56 is disposed on the first die 120.

In some embodiments, the size and the shape of the conductive protrusion 56 may be similar or equal to the first die 120. For example, after providing the conductive interposer 50 on the first circuit carrier 110, the conductive protrusion 56 may cover the first die 120. An orthographic projection area of the conductive protrusion 56 on the first circuit carrier 110 may overlap an orthographic projection area of the first die 120 on the first circuit carrier 110. In some embodiments, the orthographic projection area of the conductive protrusion 56 on the first circuit carrier 110 is equal to the orthographic projection area of the first die 120 on the first circuit carrier 110. In some embodiments, the conductive protrusion 56 may be in direct contact with the inactive surface 120b of the first die 120. In some other embodiments, the conductive protrusion 56 may be attached on the inactive surface 120b of the first die 120 using a thermal interface material (not illustrated).

For example, the conductive interposer 50 may include a die positioning region. After providing the conductive interposer 50 on the first circuit carrier 110, the die positioning region of the conductive interposer 50 may correspond to the first die 120. For example, the conductive interposer 50 may be aligned with the first die 120 through the die positioning region. In some embodiments, the plate 52 of the conductive interposer 50 may include a central region C and a peripheral region P connected to the central region C. The central region C may be referred to the die positioning region. The conductive protrusion 56 may be formed in the central region C and the conductive pillars 54 surrounding the conductive protrusion 56 may be formed in the peripheral region P.

In some embodiments, a thickness 56t of the conductive protrusion 56 is less than a height 54h of each of the conductive pillars 54. For example, after providing the conductive interposer 50 on the first circuit carrier 110, the top surface 52a of the plate 52 may be parallel to the top surface S1 of the first circuit carrier 110. A material of the conductive pillars 54 may include conductive materials such as aluminium, copper, nickel, gold or alloys thereof. In addition, the conductive pillars 54 may be formed through electroplating, photolithography and etching, or combination thereof according to the height requirement of the conductive pillars 54. For example, for the thicker first die 120, the conductive pillars 54 may be formed through the combination of electroplating and etching to obtain the conductive pillars 54 with the longer height. However, other suitable forming methods may be utilized and it construes no limitation in the disclosure. A material and the forming process of the conductive protrusion 56 may be similar to that of the conductive pillars 54. A material of the plate 52 may include the conductive materials same as the conductive pillars 54. It should be noted that the sizes and the shapes of the plate 52 and the conductive pillars 54 construe no limitation in the disclosure.

In some embodiments, the plate 52, the conductive pillar 54 and the conductive protrusion 56 may be formed integrally. In some other embodiments, the plate 52 may be fabricated separately from the conductive pillars 54 and the conductive protrusion 56. For example, a material of the plate 52 may include conductive materials or non-conductive materials such as glass, rigid plastic or the like, etc. It should be noted that other suitable material may be adapted as the plate 52 as long as the material is able to withstand the processes while carrying the conductive pillars 54 and conductive protrusion 56 formed thereon.

In some embodiments, the conductive pillars 54 of the conductive interposer 50 are coupled to the first circuit carrier 110 through a plurality of conductive pastes 140. For example, the conductive pastes 140 may be formed corresponding to the conductive pads 114a on the top surface S1 of the first circuit carrier 110 before disposing the conductive interposer 50 on the first circuit carrier 110. In some embodiments, the conductive pastes 140 may be formed on the conductive pillars 54 of the conductive interposer 50 before providing the conductive interposer 50 on the first circuit carrier 110. For example, a material of the conductive pastes 140 may include solder paste, silver paste or other suitable materials with good conductivity. In some other embodiments, after disposing the conductive pillars 54 of the conductive interposer 50 on the top surface S1 of the first circuit carrier 110 through the conductive pastes 140, a reflow process may be performed on the top surface S1 of the first circuit carrier 110 to enhance the bonding ability and the conductivity between the conductive interposer 50 and the first circuit carrier 110.

Figure 1C:
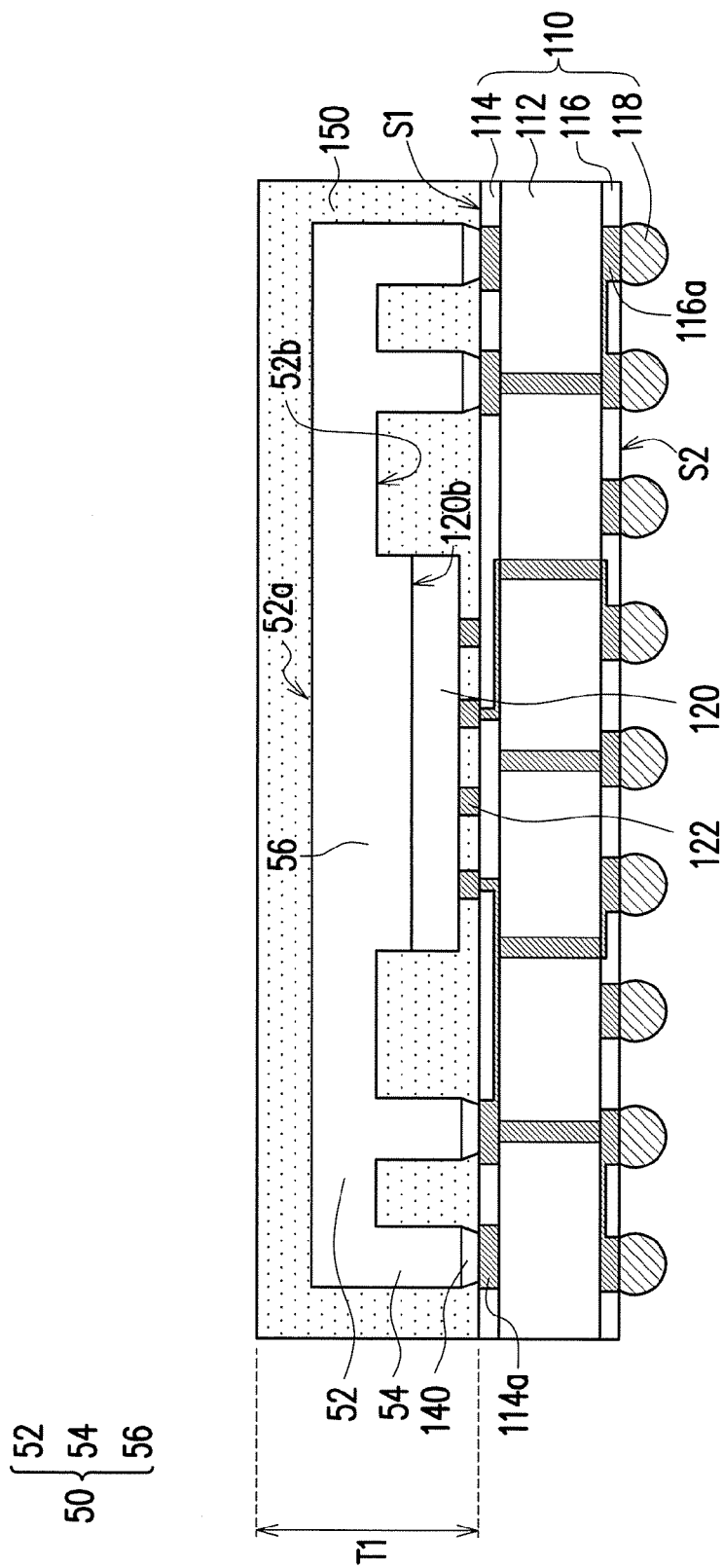

Referring to FIG. 1C, an encapsulant 150 is formed on the top surface S1 of the first circuit carrier 110 to encapsulate the conductive interposer 50 and the first die 120. For example, the encapsulant 150 may include a molding compound formed by a molding process. In some embodiments, the encapsulant 150 may be formed by an insulating material such as epoxy or other suitable resins which is not limited thereto. Moreover, a thickness T1 of the encapsulant 150 may be greater than a distance between the top surface 52a of the plate 52 and the top surface S1 of the first circuit carrier 110 to completely encapsulate the conductive interposer 50. In some embodiment, the thickness T1 of the encapsulant 150 may be equal to the distance between the top surface 52a of the plate 52 and the top surface S1 of the first circuit carrier 110. That is, the top surface 52a of the plate 52 may be exposed from the encapsulant 150 after forming the encapsulant 150. In some other embodiments, the encapsulant 150 may encapsulate the first die 120 and partially cover the conductive pillars 54 of the conductive interposer 50. In other word, the thickness T1 of the encapsulant 150 may be less than the distance between the bottom surface 52b of the conductive interposer 50 and the top surface S1 of the first circuit carrier 110 while the first die 120 is encapsulated by the encapsulant 150.

Figure 1D:
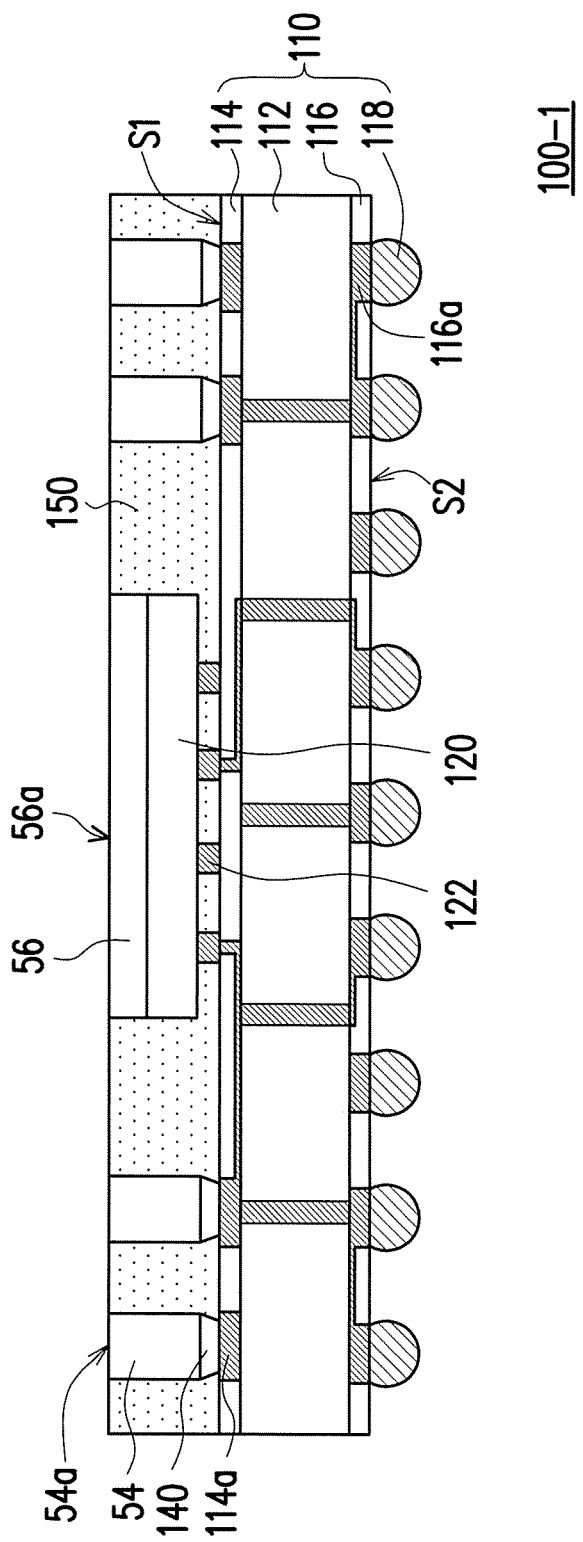

Referring to FIG. 1D, a portion of the encapsulant 150 and the plate 52 of the conductive interposer 50 are removed to form a first package structure 100-1. In some embodiments, the encapsulant 150 and the plate 52 may be removed by a grinding process. Moreover, the grinding process may be mechanical grinding, chemical mechanical polishing (CMP), etching, or other suitable methods, which is not limited thereto. In addition, after removing the portion of the encapsulant 150 and the plate 52 of the conductive interposer 50, at least a top surface 54a of each of the conductive pillars 54 and at least a top surface 56a of the conductive protrusion 56 are exposed from the encapsulant 150. After removing process, the conductive pillars 54 may be used for further electrical connection and the conductive protrusion 56 may be used for heat dissipation to achieve a better heat dissipation efficiency. In some embodiments, the top surface 54a of each of the conductive pillars 54 may be coplanar with the top surface 56a of the conductive protrusion 56 and a top surface of the encapsulant 150 after removing process. The removing process as shown in FIG. 1D is able to aid the overall thickness reduction in the package structure as a whole, thereby achieving package miniaturization. In some other embodiments, not only the portion of the encapsulant 150 and the plate 52 of the conductive interposer 50 but also a portion of the conductive pillars 54 and a portion of the conductive protrusion 56 are removed to achieve a thinner first package structure 100-1.

Figure 1E:
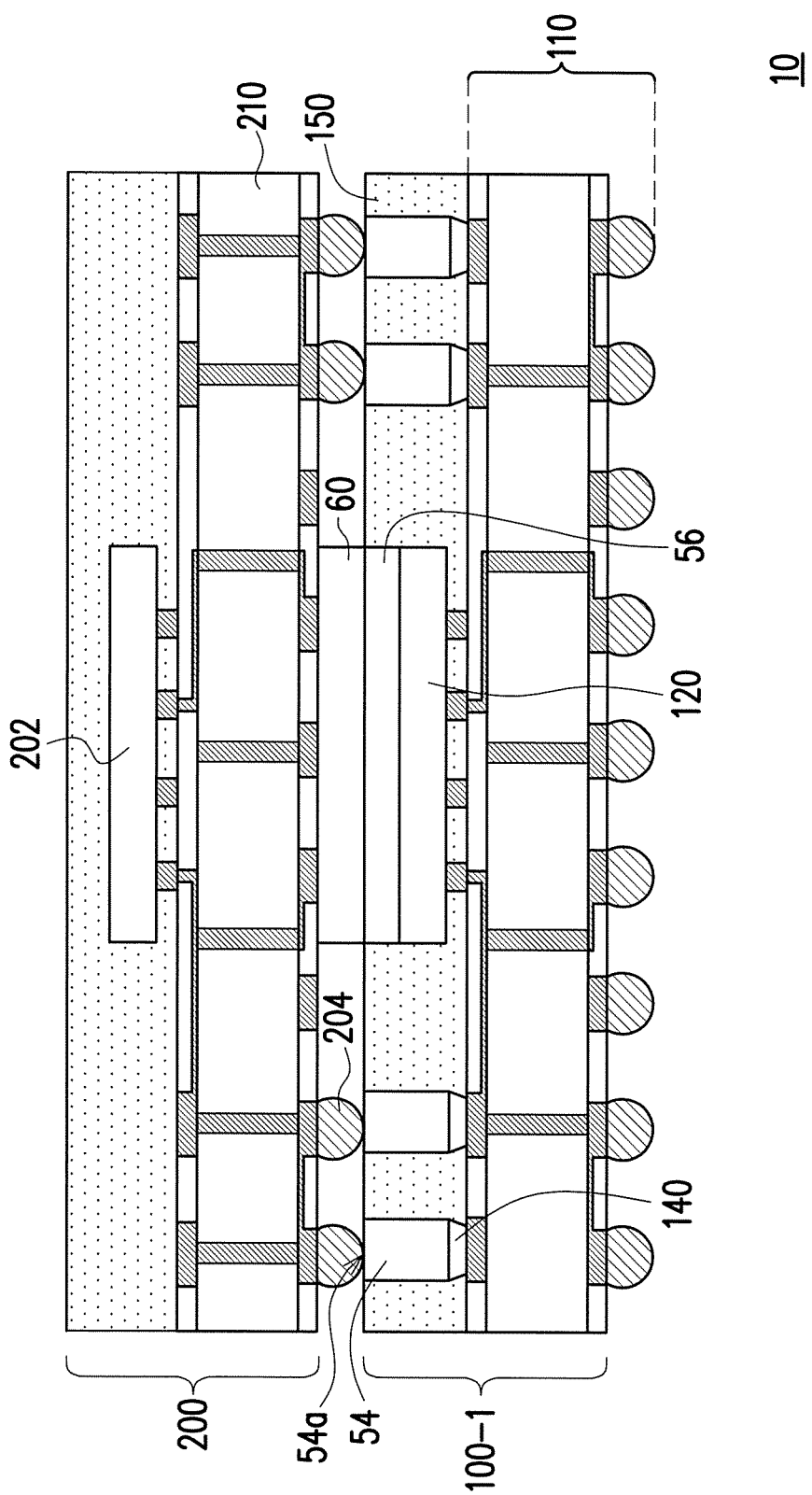

Referring to FIG. 1E, a second package structure 200 is formed on the first package structure 100-1 to form a package-on-package (POP) structure 10. For example, the second package structure 200 is electrically connected to the conductive pillars 54 of the conductive interposer 50. In some embodiments, the second package structure 200 may include a second die 202 such as DRAM or NAND flash memory. In some embodiments, other suitable active devices may also be utilized in the second package structure 200. In some embodiments, the second package structure 200 includes a plurality of conductive terminals 204 connected to the top surface 54a of the conductive pillars 54. As such, the conductive terminals 204 may serve as the electrical connection path between the second package structure 200 and the first package structure 100-1. In some embodiments, the second die 202 and the conductive terminals 204 may be electrically connected through a second circuit carrier 210. For example, the second circuit carrier 210 may include the similar formation as the first circuit carrier 110.

In some embodiments, after removing the portion of the encapsulant 150 and the plate 52 of the conductive interposer 50, a thermal interface material (TIM) 60 may be formed on the top surface 56a of the conductive protrusion 56. The TIM 60 may be used to advantageously bond the second package structure 200 to the first package structure 100-1. In some embodiments, the TIM 60 may be used to improve the heat dissipation from the first package structure 100-1. For example, after forming the second package structure 200 on the first package structure 100-1, the TIM 60 may be in thermal contact or thermally coupled between the second package structure 200 and the first package structure 100-1 for enhancing the heat dissipation efficiency. In some embodiments, the TIM 60 has a sufficient thickness to bond between the conductive protrusion 56 and the second package structure 200. For example, the thickness of the TIM 60 may be substantially equal to the height of each of the conductive terminals 204 after bonding the first package structure 100-1 and the second package structure 200. The TIM 60 may be conducive to balance the overall POP structure 10 and the stress applied onto the POP structure 10 during the subsequent reliability tests may be shared by the TIM, thereby increasing the reliability of the POP structure 10.

Figure 2A:
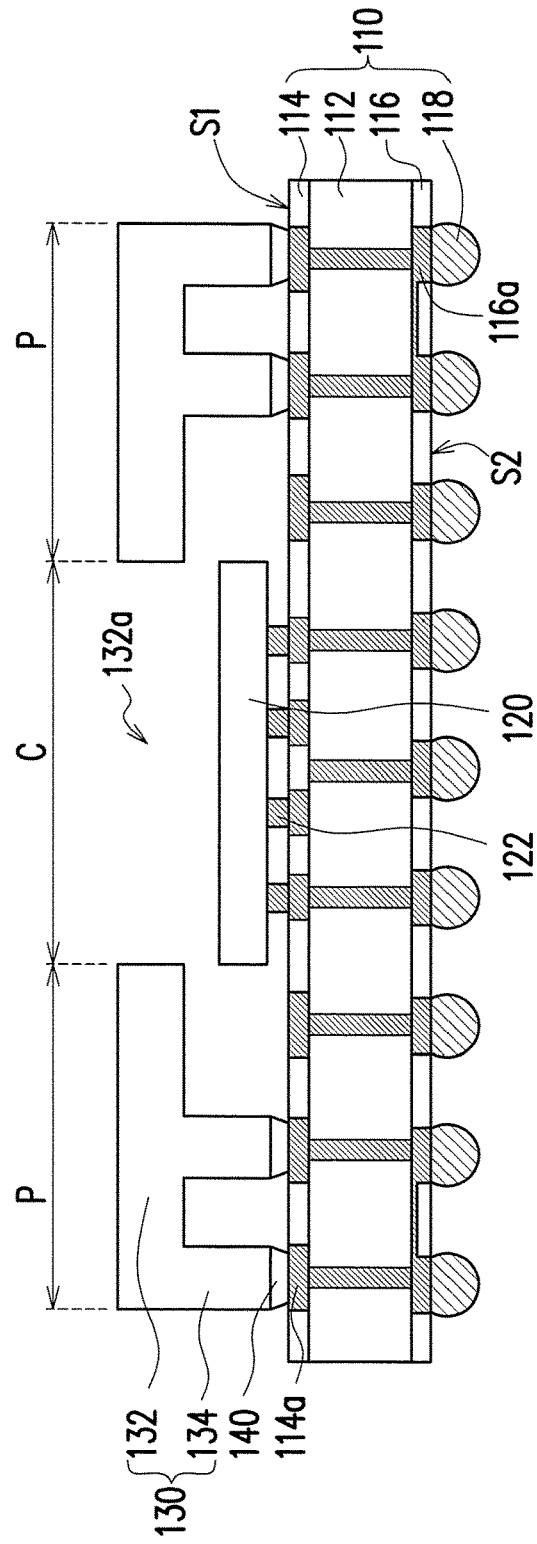
FIG. 2A to FIG. 2D are schematic cross-sectional views illustrating manufacturing method of a POP structure according to another embodiment of the disclosure.
Figure 2B:
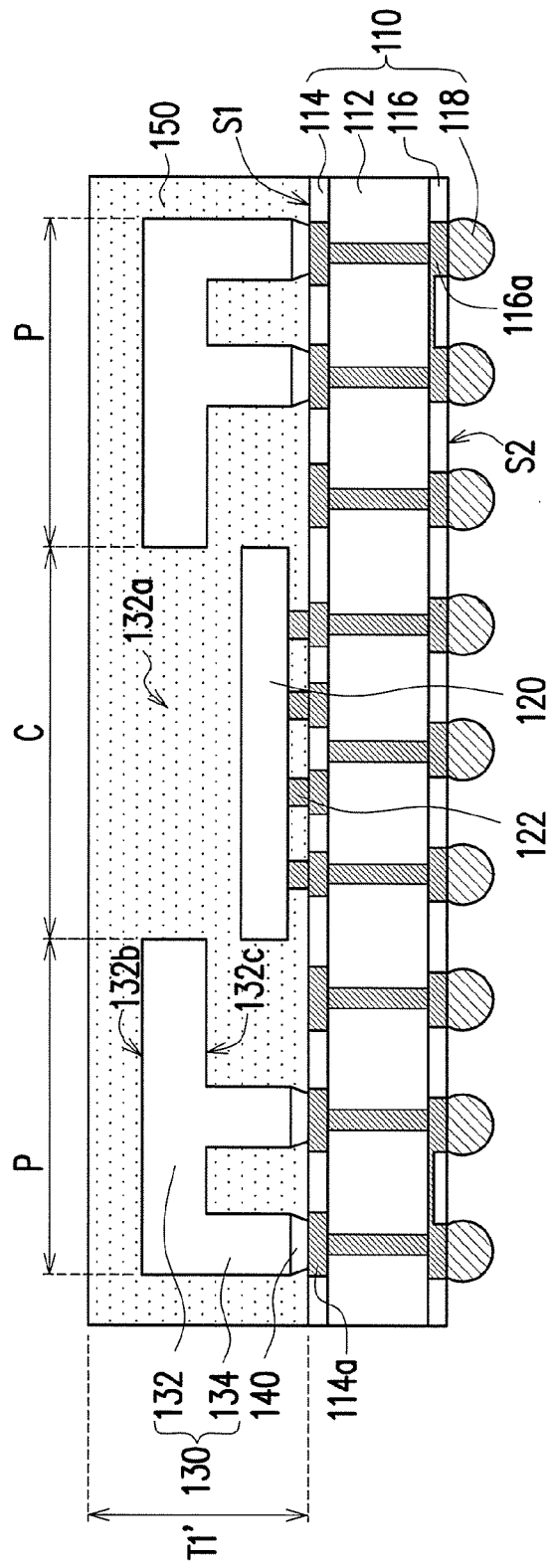
Figure 2C:
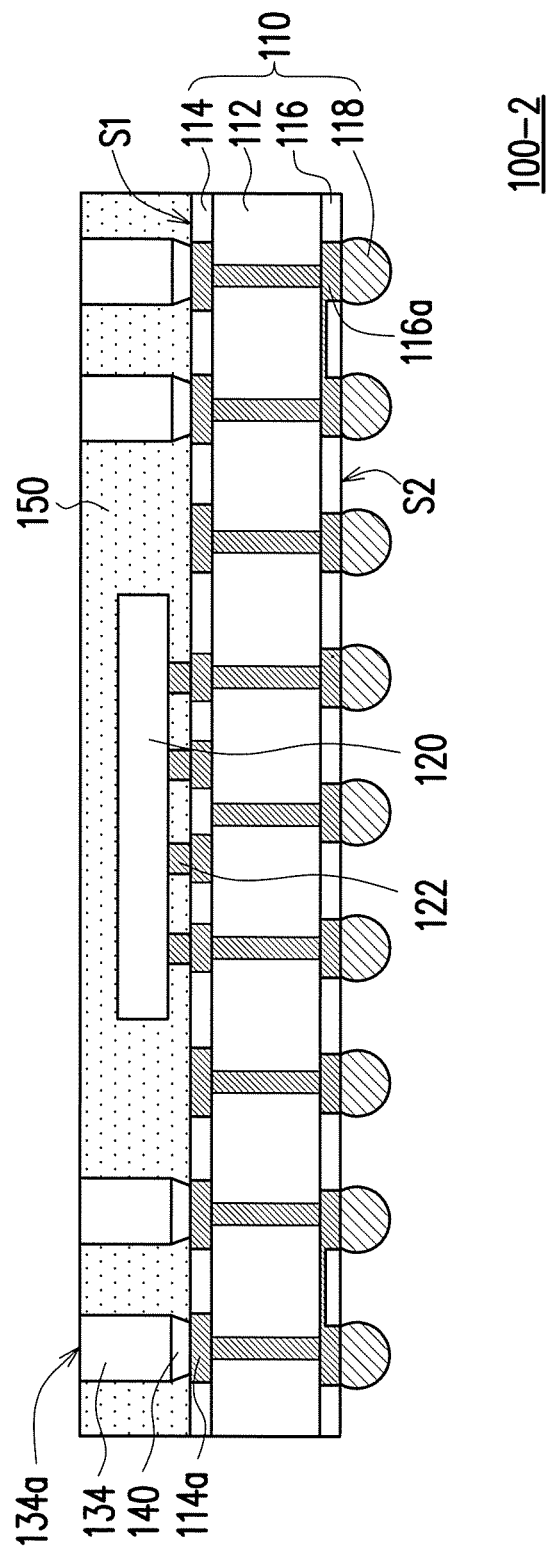
Figure 2D:
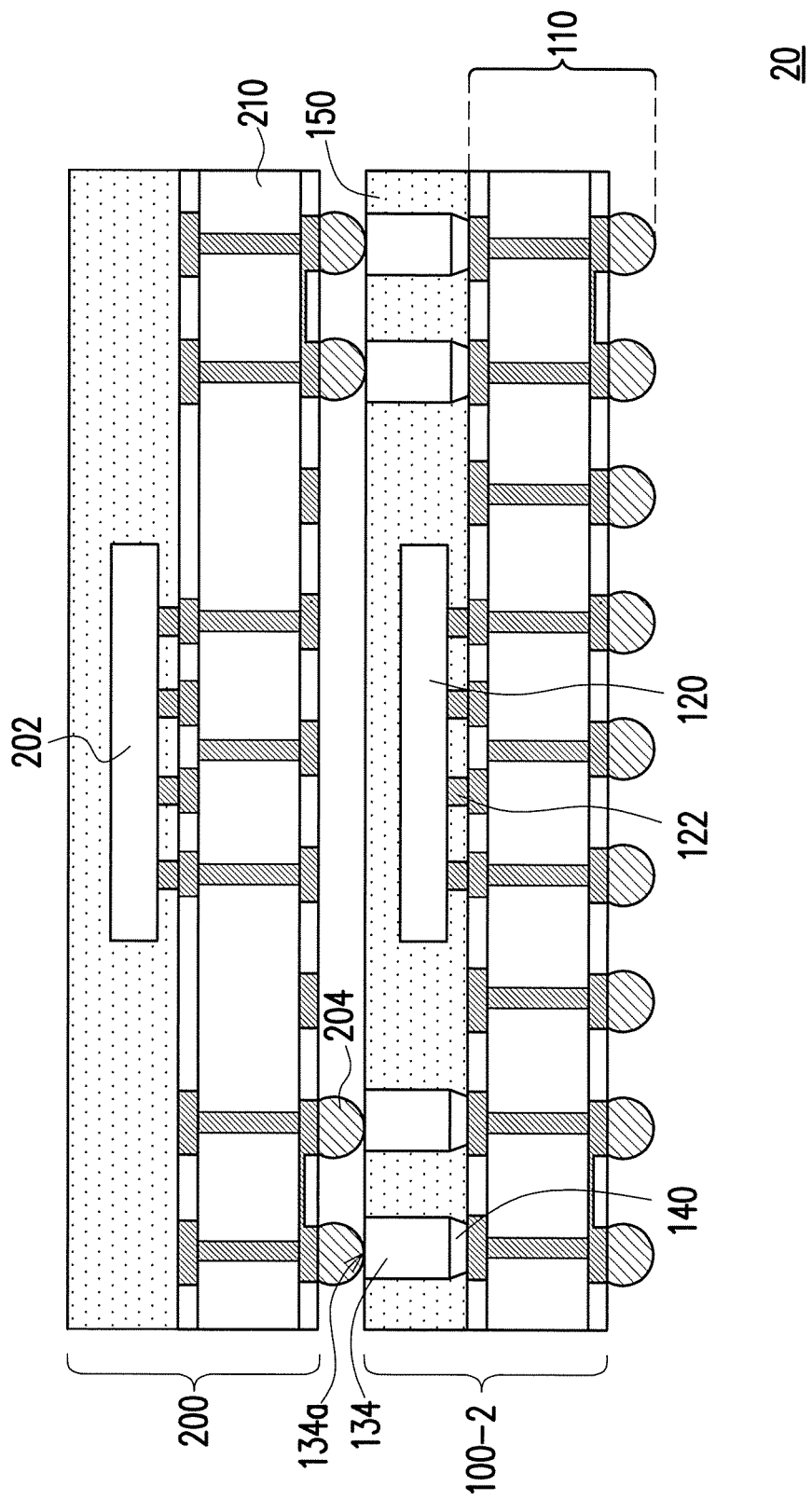
Figure 3:
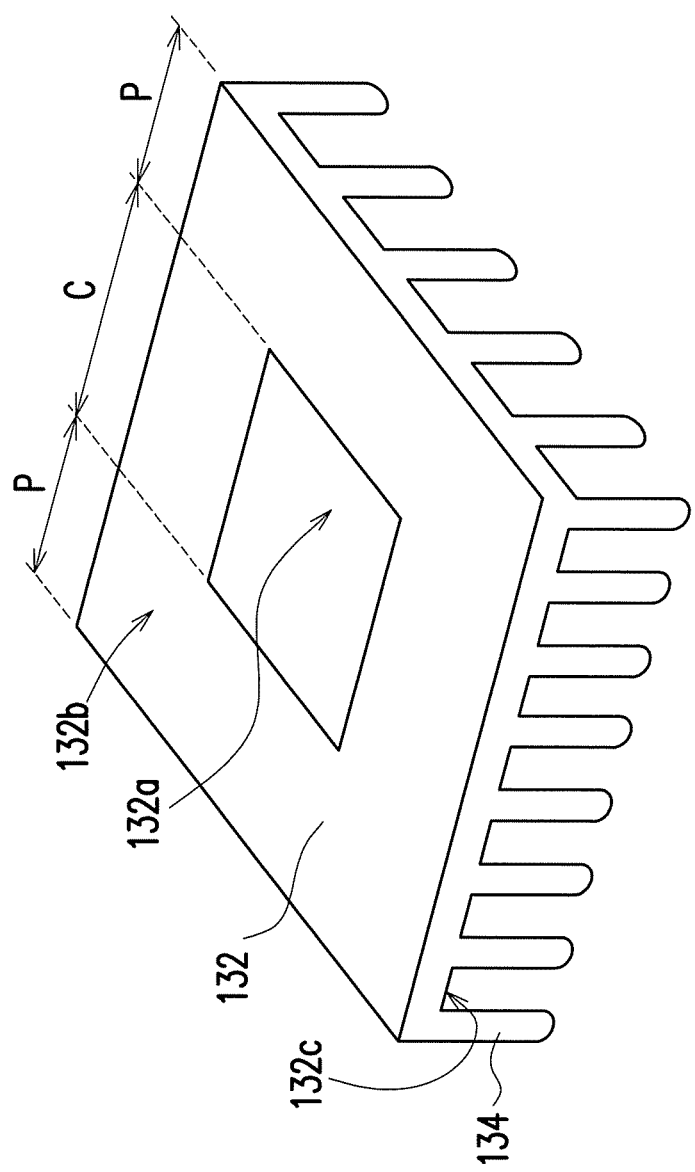
FIG. 3 is a schematic perspective view illustrating a conductive interposer according to an embodiment of the disclosure.

FIG. 2A to FIG. 2D are schematic cross-sectional views illustrating manufacturing method of a POP structure according to another embodiment of the disclosure and FIG. 3 is a schematic perspective view illustrating a conductive interposer according to an embodiment of the disclosure. Referring to FIG. 2A and FIG. 3, the first circuit carrier 110 and the first die 120 disposed on the first circuit carrier 110 is provided as illustrated in FIG. 1A. The detailed descriptions are omitted for brevity.

After providing the first circuit carrier 110 and the first die 120, a conductive interposer 130 is provided on the first circuit carrier 110. In some embodiments, the conductive interposer 130 may include a plate 132 and a plurality of conductive pillars 134. In addition, the plate 132 may have an alignment window 132a and the conductive pillars 134 may extend from the plate 132 to the first circuit carrier 110. For example, the plate 132 of the conductive interposer 130 may include a central region C (also referred to the die positioning region) and a peripheral region P connected to the central region C. Moreover, the alignment window 132a of the plate 132 may be formed at the central region C corresponding to the first die 120 and the conductive pillars 134 may be formed at the peripheral region P. For example, the conductive pillars 134 may be arranged along the edges of the plate 132 and be formed perpendicular to the plate 132.

The alignment window 132a of the plate 132 may expose the first die 120. For example, the size and the shape of the alignment window 132a may be similar or equal to the first die 120 such that the alignment window 132a of the conductive interposer 130 may be aligned with the first die 120 through the alignment window 132a. In some embodiments, an orthographic projection area of the alignment window 132a on the first circuit carrier 110 overlaps and is equal to an orthographic projection area of the first die 120 on the first circuit carrier 110. In some other embodiments, at least an edge of the first die 120 may be exposed from the alignment window 132a of the plate 132 of the conductive interposer 130 for alignment. For example, when disposing the conductive interposer 130 on the first circuit carrier 110, at least one edge of the first die 120 may be positioned through the alignment window 132a of the plate 132 of the conductive interposer 130 so that the conductive pillars 134 of the conductive interposer 130 may be bonded corresponding to the conductive pads 114a of the first circuit carrier 110. In other word, the alignment window 132a is conducive to position the first die 120 and further enhance the accuracy of the electrical connection between the conductive pillars 134 of the conductive interposer and the first circuit carrier 110. It should be noted that the number, the shape and the size of the alignment window 132a construe no limitation as long as the first die 120 can be positioned through the alignment window 132a when disposing the conductive interposer 130 on the first circuit carrier 110, thereby achieving the precise alignment therebetween.

For example, the plate 132 and the conductive pillar 134 of the conductive interposer 130 may be formed integrally. A material and the forming process of the conductive pillars 134 may be similar to that of the conductive pillars 56 illustrated in FIG. 1B, and the detailed description are not repeated herein. The alignment window 132a of the plate 132 may be formed through mechanical drilling, photolithography and etching or other suitable methods, which is not limited thereto. For example, the alignment window 132a of the plate 132 may be formed together with the conductive pillars 134 in the same process. In addition, the alignment window 132a of the plate 132 may be formed before or after forming the conductive pillars 134. It should be noted that the sequence of forming the alignment window 132a and the conductive pillars 134 construes no limitation in the disclosure.

In some embodiments, the conductive pillars 134 of the conductive interposer 130 are connected to the first circuit carrier 110 through the conductive pastes 140. The forming process of the conductive pastes 140 may be similar as described in FIG. 1B, and the detailed descriptions are not repeated herein. For example, after bonding the conductive interposer 130 on the first circuit carrier 110, a bottom surface 132c of the plate 132 of the conductive interposer 130 may be higher than the inactive surface 120b of the first die 120 relative to the top surface S1 of the first circuit carrier 110. In some other embodiments, after bonding the conductive interposer 130 on the first circuit carrier 110, the bottom surface 132c of the plate 132 of the conductive interposer 130 and the inactive surface 120b of the first die 120 may be coplanar.

Referring to FIG. 2B, the encapsulant 150 is formed on the top surface S1 of the first circuit carrier 110 to encapsulate the conductive interposer 130 and the first die 120. Moreover, the thickness T1' of the encapsulant 150 may be greater than a distance between the plate 132 of the conductive interposer 130 and the top surface S1 of the first circuit carrier 110 to completely encapsulate the conductive interposer 130. In some embodiment, the thickness T1' of the encapsulant 150 may be equal to the distance between the plate 132 of the conductive interposer 130 and the top surface S1 of the first circuit carrier 110. That is, a top surface 132b opposite to the bottom surface 132c of the plate 132 may be exposed from the encapsulant 150 after forming the encapsulant 150. In some other embodiments, the encapsulant 150 may encapsulate the first die 120 and partially cover the conductive pillars 134 of the conductive interposer 130. In other word, the thickness T1' of the encapsulant 150 may be less than the distance between the bottom surface 132c of the conductive interposer 130 and the top surface S1 of the first circuit carrier 110 while the first die 120 is encapsulated by the encapsulant 150.

Referring to FIG. 2C, a portion of the encapsulant 150 and the plate 132 of the conductive interposer 130 are removed to form a first package structure 100-2. The removing process may be similar to the embodiment illustrated in FIG. 1D, and the detailed descriptions are not repeated herein. After removing the portion of the encapsulant 150 and the plate 132 of the conductive interposer 130, at least a top surface 134a of each of the conductive pillars 134 are exposed from the encapsulant 150. As such, the conductive pillars 134 of the conductive interposer 130 may be used for further electrical connection. In some embodiments, not only the portion of the encapsulant 150 and the plate 132 of the conductive interposer 130 but also a portion of the conductive pillars 134 of the conductive interposer 130 are removed to achieve a thinner first package structure 100-2.

Referring to FIG. 2D, the second package structure 200 is formed on the first package structure 100-2 to form a POP structure 20. For example, the second package structure 200 is electrically connected to the conductive pillars 134 of the conductive interposer 130. In some embodiments, the conductive terminals 204 may be formed corresponding to the top surface 134a of the conductive pillars 134. As such, the conductive terminals 204 may serve as the electrical connection path between the second package structure 200 and the first package structure 100-2.

Figure 4A:
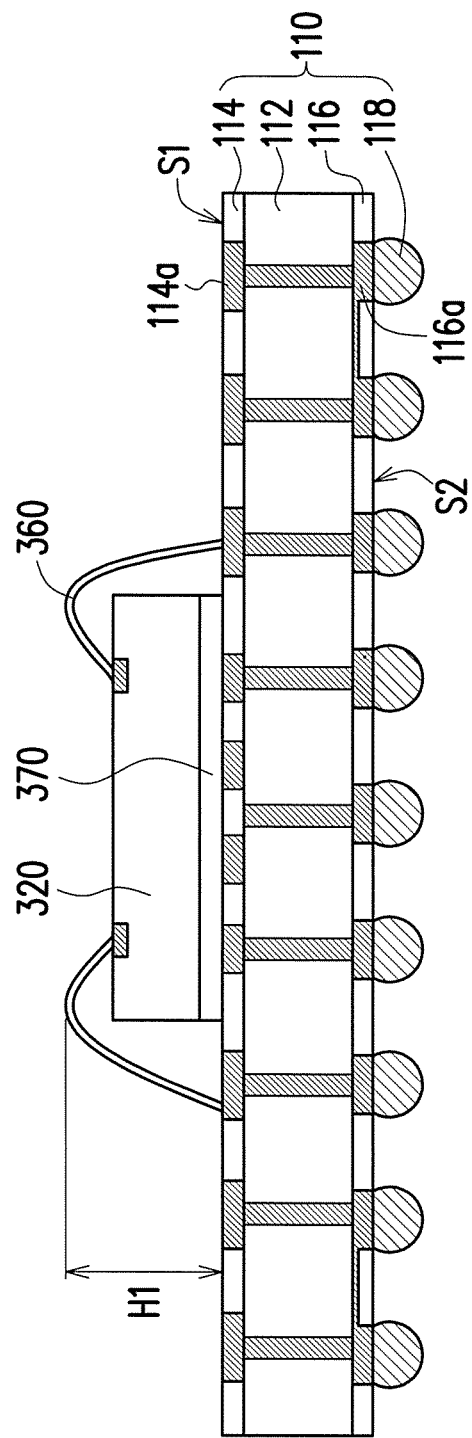
FIG. 4A to FIG. 4E are schematic cross-sectional views illustrating manufacturing method of a POP structure according to yet another embodiment of the disclosure.

FIG. 4A to FIG. 4E are schematic cross-sectional views illustrating manufacturing method of a POP structure according to yet another embodiment of the disclosure. Referring to FIG. 4A, the first circuit carrier 110 is provided and a first die 320 is bonded on the first circuit carrier 110. For example, the first die 320 may be an ASIC (Application-Specific Integrated Circuit). In some embodiments, the first die 320 may be used to perform logic applications. However, it construes no limitation in the disclosure. The main difference between the embodiment in FIG. 4A and the embodiment in FIG. 1A lies in that the first die 320 is electrically connected to the first circuit carrier 110 through a plurality of conductive wires 360.

For example, the conductive wires 360 may be formed through a wire bonder (not illustrated). The types of the wire bonder may include wedge bond or ball bond or other suitable wire bonder according to the design requirement, which is not limited thereto. A material of the conductive wires 360 may be gold, copper or other suitable material, which is not limited thereto. In one embodiment, the conductive wires 360 may be formed from the first circuit carrier 110 to the first die 320. In some other embodiments, the conductive wires 360 may be formed from the first die 320 to the first circuit carrier 110. The forming sequence of the conductive wires 360 may depend on the design requirement, which is not limited thereto. A peak of each of the conductive wires 360 is defined as the highest point relative to the two ends of each of the conductive wires 360 after connecting the first circuit carrier 110 and the first die 320. In addition, a loop height H1 of each of the conductive wires 360 is defined as a distance between the peak of each of the conductive wires 360 and the first circuit carrier 110. It should be noted that the loop height H1 of each of the conductive wires 360 depends on the types of the wire bonder and/or the design requirement.

Furthermore, an adhesive layer 370 may be disposed between the first die 320 and the first circuit carrier 110 for enhancement of bonding the first die 320 to the first circuit carrier 110. For example, the adhesive layer 370 may be a die attach film, silver paste, or the like. In some embodiments, other suitable materials of the adhesive layer 370 may be utilized for enhancing the adhesion between the first die 320 and the first circuit carrier 110.

Figure 4B:
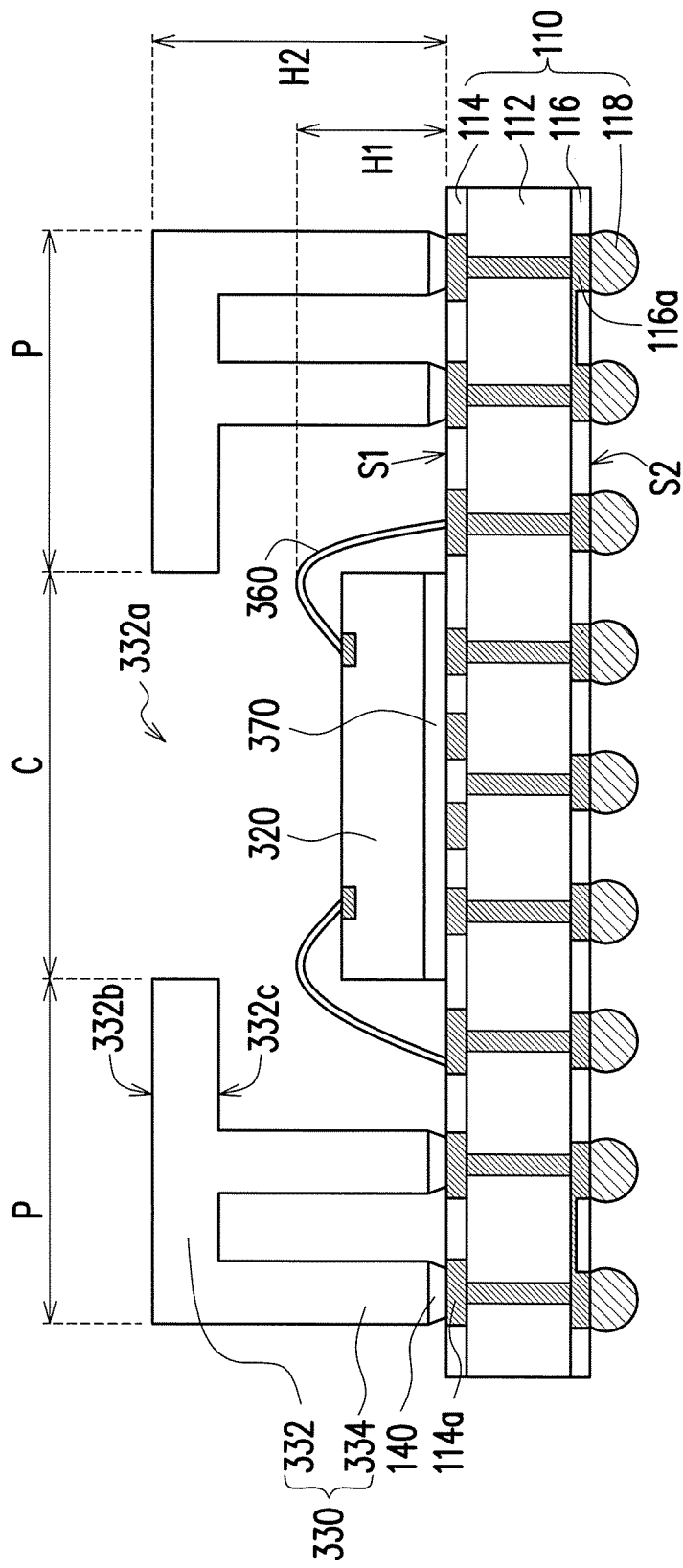

Referring to FIG. 4B and FIG. 3, a conductive interposer 330 is bonded on the first circuit carrier 110 through the conductive pastes 140. The bonding process of the conductive pastes 140 of the present embodiment is similar to the embodiment illustrated in FIG. 2A. The detailed descriptions are omitted herein. In addition, the conductive interposer 330, similar to the conductive interposer 130 illustrated in FIG. 2A, includes a plate 332 having an alignment window 332a and a plurality of conductive pillars 334. Moreover, the formation of the conductive interposer 330 of the present embodiment is similar to the conductive interposer 130 illustrated in FIG. 2A. Therefore, the detailed description of the forming process of the conductive interposer 330 is not repeated herein. The difference between the conductive interposer 330 of the present embodiment and the conductive interposer 130 illustrated in FIG. 2A lies in that a height H2 of the conductive interposer 330 is greater than the loop height H1 of each of the conductive wires 360. For example, the height H2 of the conductive interposer 330 is defined as a distance between a top surface 332b of the plate 332 of the conductive interposer 330 to the top surface S1 of the first circuit carrier 110. As such, after bonding the conductive interposer 330 on the first circuit carrier 110, the conductive interposer 330 is not contact with the conductive wires 360 so the process of bonding the conductive interposer 330 does not affect the reliability of the first die 320.

Figure 4C:
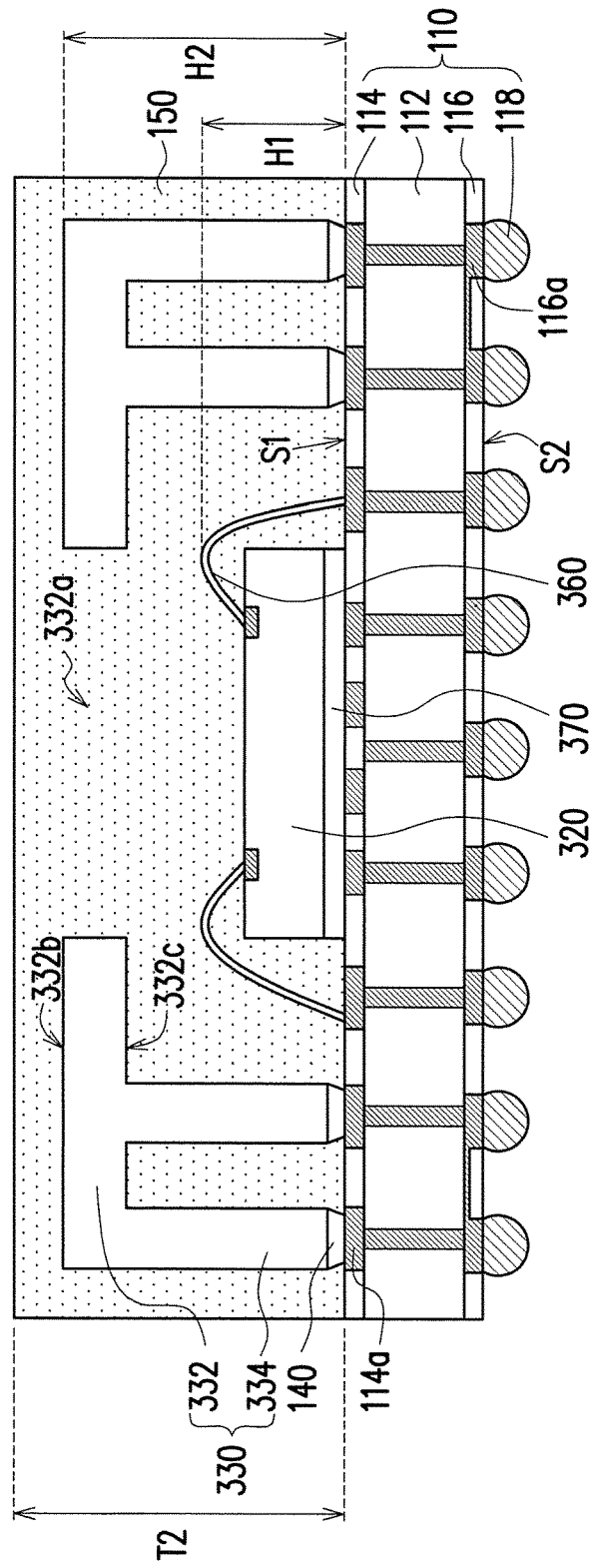

Referring to FIG. 4C, the encapsulant 150 is formed on the top surface S1 of the first circuit carrier 110 to encapsulate the conductive interposer 330, the first die 320 the adhesive layer 370 and the conductive wires 360. It should be noted that the forming process of the encapsulant 150 of the embodiment illustrated in FIG. 4C is similar to the forming process of the encapsulant 150 of the embodiment shown in FIG. 2B, so the detailed descriptions are omitted herein. Moreover, a thickness T2 of the encapsulant 150 may be greater than a distance between the plate 332 of the conductive interposer 330 and the top surface S1 of the first circuit carrier 110 to completely encapsulate the conductive interposer 330. In some embodiment, the thickness T2 of the encapsulant 150 may be equal to the distance between the plate 332 of the conductive interposer 330 and the top surface S1 of the first circuit carrier 110. That is, the top surface 332b of the plate 332 may be exposed from the encapsulant 150 after forming the encapsulant 150. In some other embodiments, the encapsulant 150 may completely encapsulate the conductive wires 360 and partially expose the conductive interposer 330. In other word, the thickness T2 of the encapsulant 150 may be less than the distance between a bottom surface 332c opposite to the top surface 332b of the plate 332 of the conductive interposer 330 and the top surface S1 of the first circuit carrier 110 while the first die 320 is encapsulated by the encapsulant 150.

Figure 4D:
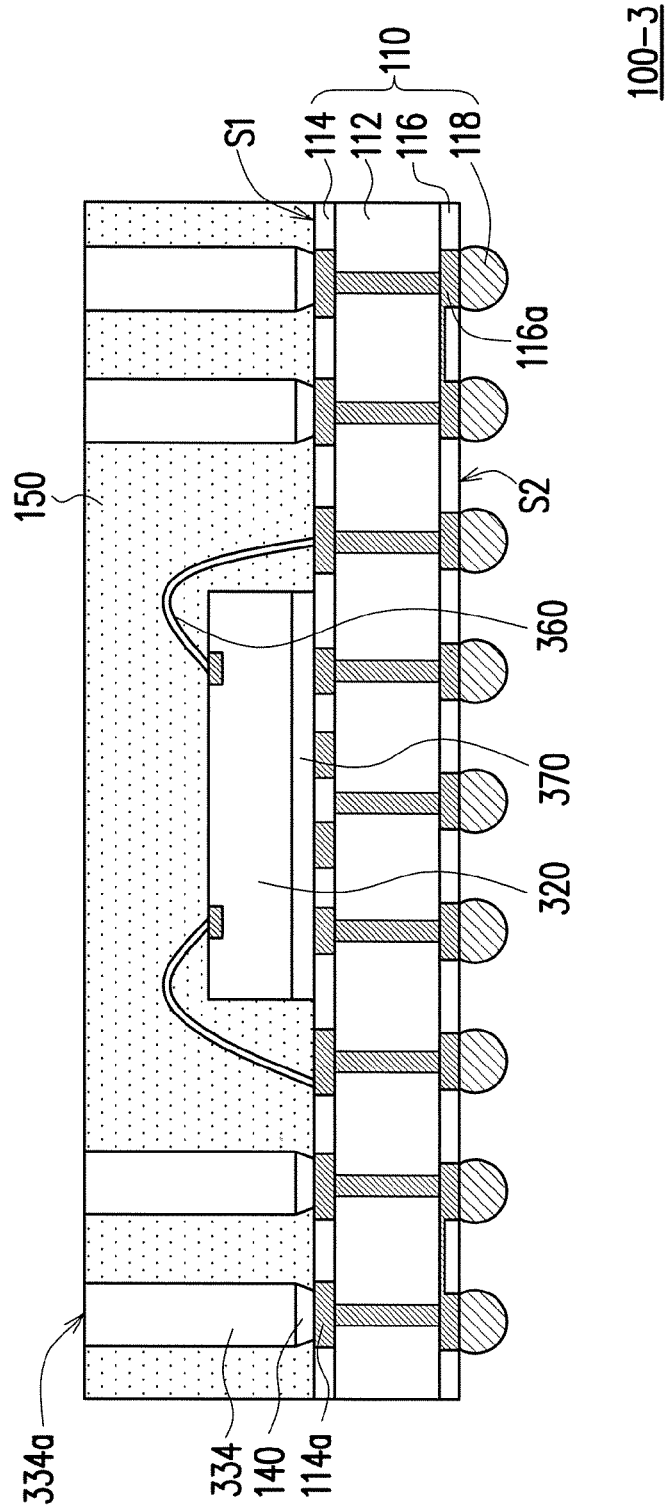

Referring to FIG. 4D, a portion of the encapsulant 150 and the plate 332 of the conductive interposer 330 are removed to form a first package structure 100-3. The removing process of the encapsulant 150 and the plate 332 of the present embodiment is similar to the embodiment illustrated in FIG. 2C. The detailed descriptions are omitted herein. In addition, after removing the portion of the encapsulant 150 and the plate 332 of the conductive interposer 330, at least a top surface 334a of each of the conductive pillars 334 of the conductive interposer 330 are exposed by the encapsulant 150. As such, the conductive pillars 334 of the conductive interposer 330 may serve as the conductive path for further electrical connection. In addition, the removing process shown in FIG. 4D is able to aid the overall thickness reduction in the package structure as a whole, thereby achieving package miniaturization. In some embodiments, not only the portion of the encapsulant 150 and the plate 332 of the conductive interposer 330 but also a portion of the conductive pillars 334 of the conductive interposer 330 are removed, while the conductive wires 360 are encapsulated by the encapsulant 150, thereby achieving a thinner first package structure 300.

Figure 4E:
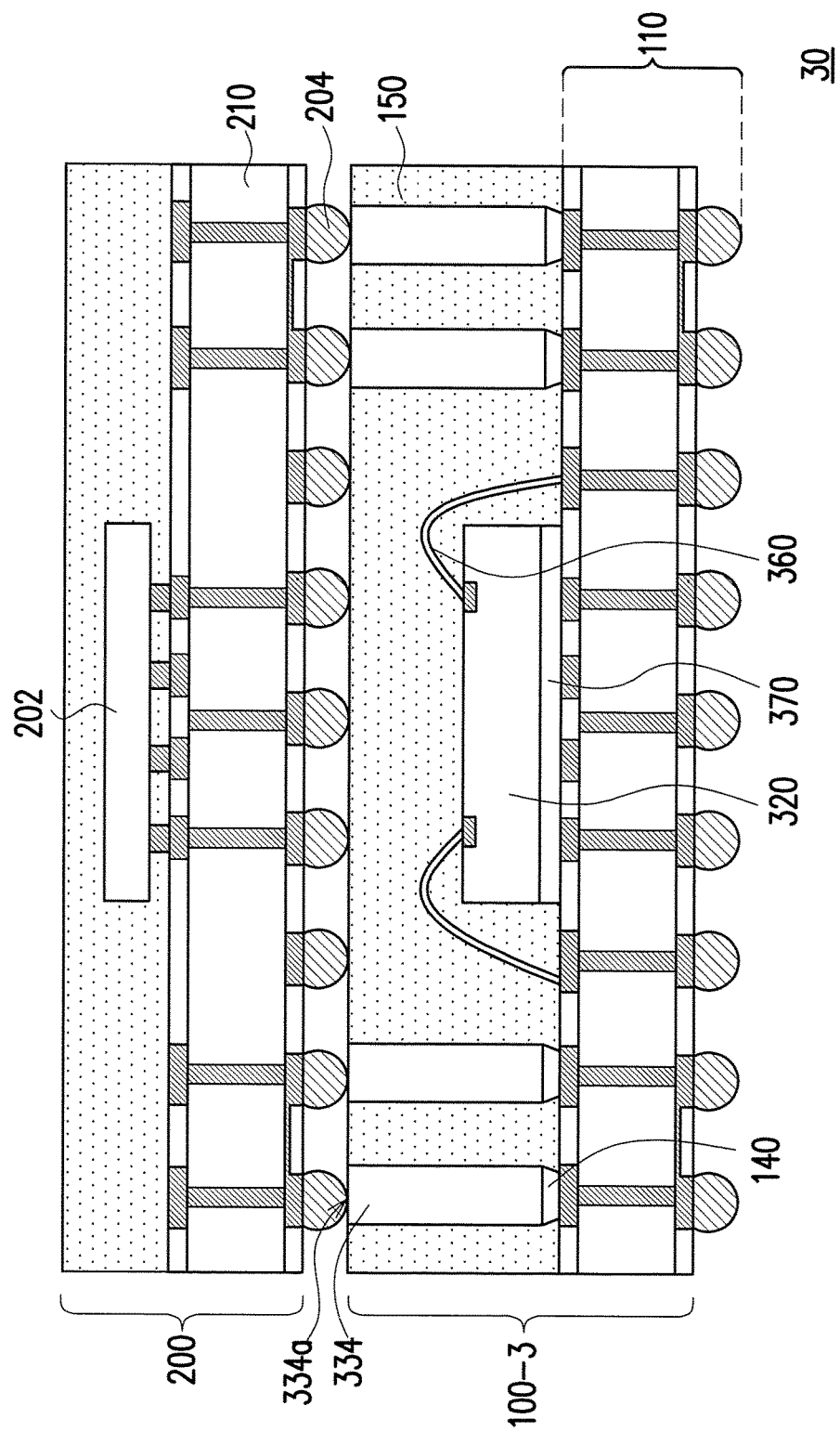

Referring to FIG. 4E, the second package structure 200 is formed on the first package structure 300 to form a POP structure 30. For example, the second package structure 200 is electrically connected to the conductive pillars 334 of the conductive interposer 330. In some embodiments, the conductive terminals 204 may be formed corresponding to the top surface 334a of the conductive pillars 334 of the conductive interposer 330. As such, the conductive terminals 204 may serve as the electrical connecting path between the second package structure 200 and the first package structure 300. In other word, the second die 210 of the second package structure 200 is electrically connected to the first circuit carrier 110 of the first package structure 300 through the conductive terminals 204 and the conductive pillars 330 of the conductive interposer 330.

Based on the above, since at least the conductive plate of the conductive interposer are removed, the conductive pillars exposed from the encapsulant may serve as the electrical connecting path between the first package structure and the second package structure and the conductive protrusion may exposed from the encapsulant may serve as the heat sink for a better heat dissipation efficiency. It is unnecessary to dispose additional interposer between the first package structure and the second package structure for electrical connection therebetween. The overall thickness reduction in the package structure can be reduced after removing a portion of the encapsulant and a plate of the conductive interposer, thereby achieving package miniaturization. The thermal interface material formed on the top surface of the conductive protrusion is conducive to bond the second package structure to the first package structure and improve heat dissipation from the first package structure. When the conductive interposer having the alignment window is disposed on the circuit carrier, the alignment window is conducive to align the conductive interposer with the die. As such, it is no need to form additional alignment mark to align the conductive interposer and the die. Therefore, the manufacturing cost may be reduced.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A manufacturing method of a package-on-package (POP) structure, comprising:
    forming a first package structure, wherein the first package structure comprises a circuit carrier and a die disposed on the circuit carrier, forming the first package structure comprising:
    providing a conductive interposer on the circuit carrier, wherein the conductive interposer comprises a plate, a plurality of conductive pillars and a conductive protrusion respectively extending from the plate to the circuit carrier and the die, the conductive protrusion disposed on the die, and the conductive pillars are electrically connected to the circuit carrier, wherein the plate of the conductive interposer comprises a central region and a peripheral region connected to the central region, the conductive protrusion is formed in the central region and the conductive pillars are formed in the peripheral region;
    encapsulating the conductive interposer by an encapsulant; and
    removing a portion of the encapsulant and the plate of the conductive interposer; and
    forming a second package structure on the first package structure, wherein the second package structure is electrically connected to the first package structure through the conductive interposer.

2. The manufacturing method of a POP structure according to claim 1, wherein after providing the conductive interposer on the circuit carrier, an orthographic projection area of the conductive protrusion on the circuit carrier overlaps an orthographic projection area of the die on the circuit carrier.

3. The manufacturing method of a POP structure according to claim 2, wherein after providing the conductive interposer on the circuit carrier, the orthographic projection area of the conductive protrusion on the circuit carrier is equal to the orthographic projection area of the die on the circuit carrier.

4. The manufacturing method of a POP structure according to claim 1, wherein after removing the portion of the encapsulant and the plate of the conductive interposer, at least a top surface of each of the conductive pillars and a top surface of the conductive protrusion are exposed by the encapsulant.

5. The manufacturing method of a POP structure according to claim 4, wherein a thickness of the conductive protrusion is less than a height of each of the conductive pillars, after removing the portion of the encapsulant and the plate of the conductive interposer, the top surface of each of the conductive pillars is coplanar with the top surface of the conductive protrusion.

6. The manufacturing method of a POP structure according to claim 4, wherein after removing the portion of the encapsulant and the plate of the conductive interposer, forming a thermal interface material on the top surface of the conductive protrusion.

7. The manufacturing method of a POP structure according to claim 6, wherein the second package structure comprises a plurality of conductive terminals disposed on the conductive pillars, after forming the second package on the first package structure, a height of each of the conductive terminals is equal to a thickness of the thermal interface material.

8. The manufacturing method of a POP structure according to claim 1, wherein the die is electrically connected to the circuit carrier through flip-chip bonding.

9. The manufacturing method of a POP structure according to claim 1, wherein the conductive pillars of the conductive interposer are connected to the circuit carrier of the first package structure through a plurality of conductive pastes.

10. A manufacturing method of a package-on-package (POP) structure, comprising:
    forming a first package structure, wherein the first package structure comprises a circuit carrier and a die disposed on the circuit carrier, forming the first package structure comprising:
    providing a conductive interposer on the circuit carrier, wherein the conductive interposer comprises a die positioning region, a plate, and a plurality of conductive pillars formed on the plate and surrounding the die positioning region, an orthographic projection area of the die positioning region on the circuit carrier is equal to an orthographic projection area of the die on the circuit carrier, and the die positioning region comprises an alignment window formed at the plate, wherein after providing the conductive interposer on the circuit carrier, the alignment window is aligned with the die and exposes at least an edge of the die;
    encapsulating the conductive interposer by an encapsulant; and
    removing a portion of the encapsulant and a portion of the conductive interposer, wherein a surface of the conductive interposer is exposed by the encapsulant; and
    forming a second package structure on the first package structure, wherein the second package structure is electrically connected to the first package structure through the conductive interposer.

11. The manufacturing method of a POP structure according to claim 10, wherein the conductive interposer comprises a conductive protrusion located in the die positioning region and surrounded by the conductive pillars, after providing the conductive interposer on the circuit carrier, the conductive pillars are electrically connected to the circuit carrier and the conductive protrusion is disposed on the die.

12. The manufacturing method of a POP structure according to claim 11, wherein a thickness of the conductive protrusion is less than a height of each of the conductive pillars, after removing the portion of the encapsulant and the plate of the conductive interposer, at least a top surface of each of the conductive pillars and a top surface of the conductive protrusion are exposed by the encapsulant.

13. The manufacturing method of a POP structure according to claim 12, wherein after removing the portion of the encapsulant and the plate of the conductive interposer, the top surface of each of the conductive pillars is coplanar with the top surface of the conductive protrusion.

14. The manufacturing method of a POP structure according to claim 11, wherein after removing the portion of the encapsulant and the plate of the conductive interposer, forming a thermal interface material on the top surface of the conductive protrusion.

15. The manufacturing method of a POP structure according to claim 14, wherein the second package structure comprises a plurality of conductive terminals disposed on the conductive pillars, after forming the second package on the first package structure, a height of each of the conductive terminals is equal to a thickness of the thermal interface material.

16. The manufacturing method of a POP structure according to claim 10, wherein the die is electrically connected to the circuit carrier through a plurality of conductive wires.

17. The manufacturing method of a POP structure according to claim 16, wherein a height of the conductive interposer is greater than a loop height of each of the conductive wires before removing the portion of the encapsulant and the portion of the conductive interposer.

18. The manufacturing method of a POP structure according to claim 16, wherein a thickness of the encapsulant is greater than a loop height of each of the conductive wires after removing the portion of the encapsulant and the portion of the conductive interposer.

* * * * *